(12) United States Patent
Moertel et al.

(10) Patent No.: US 9,071,212 B2
(45) Date of Patent: Jun. 30, 2015

(54) AUDIO AMPLIFIER

(71) Applicant: d&b audiotechnik GmbH, Backnang (DE)

(72) Inventors: Sven Moertel, Aspach (DE); Claus Renftle, Backnang (DE); Hermann Vogt, Leingarten (DE)

(73) Assignee: d&b audiotechnik GmbH, Backnang (DE)

(*) Notice: Subject to any disclaimer, the term of this patent is extended or adjusted under 35 U.S.C. 154(b) by 335 days.

(21) Appl. No.: 13/628,431

(22) Filed: Sep. 27, 2012

(65) Prior Publication Data

US 2013/0083947 A1   Apr. 4, 2013

(30) Foreign Application Priority Data

Sep. 29, 2011   (DE) .............. 102011054060

(51) Int. Cl.
*H03F 13/00* (2006.01)
*H03F 1/52* (2006.01)
*H03F 3/20* (2006.01)

(52) U.S. Cl.
CPC ............ *H03F 13/00* (2013.01); *H03F 1/52* (2013.01); *H03F 3/20* (2013.01)

(58) Field of Classification Search
CPC ................................. H03F 13/00; H03F 3/04
USPC ............... 381/120, 104, 106–107, 55
See application file for complete search history.

(56) References Cited

U.S. PATENT DOCUMENTS 6,173,056 B1 * 1/2001 Romesburg et al. ..... 379/406.01
8,036,402 B2 * 10/2011 Furge ............................ 381/120
2002/0089316 A1   7/2002 Liu
2004/0178852 A1   9/2004 Neunaber
2007/0057720 A1   3/2007 Hand et al.
2007/0140513 A1 * 6/2007 Furge ............................ 381/120
2008/0056504 A1   3/2008 Gorges et al.
2009/0257599 A1  10/2009 Sand Jensen et al.
2011/0158437 A1 * 6/2011 Taffner et al. ................. 381/120
2012/0002819 A1   1/2012 Thormundsson et al.

FOREIGN PATENT DOCUMENTS

DE   3536306 A1   4/1987
WO   2008143124 A1   11/2008

OTHER PUBLICATIONS

LAB Gruppen, "C Series Operation Manual rev 2.2.0", 21 Pages, Retrieved Aug. 21, 2012, http://labgruppen.com/products/plm_series_touring/.
LAB Gruppen, "Technology Brief", pp. 1-8, Retrieved Aug. 21, 2012, http://labgruppen.com/products/plm_series_touring/.
Office Action cited in German Patent Application dated Jun. 20, 2012, pp. 1-4.

* cited by examiner

*Primary Examiner* — Disler Paul
(74) *Attorney, Agent, or Firm* — Cooper Legal Group, LLC

(57) ABSTRACT

An audio amplifier may comprise a signal limiting circuit and a power amplifier. The signal limiting circuit may be configured to limit an audio signal received at an input and to provide it as a limited audio signal at an output. The power amplifier may have a supply connection which may be coupled to a power supply unit in order to supply power to the power amplifier. The power amplifier may be configured to amplify a signal, which may be based on the limited audio signal, and to provide it as a level-limited audio signal at an output which may be coupled to a load, so that the load may be operated at limited power. The signal limiting circuit may be configured to produce an audio signal which may be limited depending on the load.

20 Claims, 6 Drawing Sheets

AUDIO AMPLIFIER

RELATED APPLICATION

This application corresponds to German Patent Application 10 2011 054 060.1, filed on Sep. 29, 2011, at least some of which may be incorporated herein.

BACKGROUND

An audio amplifier may comprise a power amplifier and e.g. a power supply unit. For some years, some audio amplifiers have also been equipped with signal processing units known as digital signal processors (DSPs). Demands on the possible output power of audio amplifiers for professional use are increasing. Audio signals may be pulsed, and may have high peak values with a simultaneously relatively low RMS value. As a result, high powers demanded from audio amplifiers may merely be needed for a relatively short time. This property is taken into account when designing power electronics assemblies for an audio amplifier, and said power electronics assemblies are thus able to deliver high voltages and currents on a short-term basis. On a permanent basis, these high powers may overtax the power electronics assemblies, which can be destroyed on account of overheating, for example. A current supply line is normally protected from overload by a circuit breaker, which may disconnect the supply of current and hence the audio amplifier in the event of excessive loading.

In order to inhibit the power electronics assemblies of an audio amplifier from being destroyed, it may be useful to provide for power to be reduced in the course of operation when the power becomes excessive. This may be accomplished by using power supply units in which the output voltage falls under load. This may decrease the supply voltage for the power amplifier, and the maximum output voltage of the power amplifier may be reduced.

However, a disadvantage in this case may be that the power reduction may affect the tonal properties of the audio amplifier, specifically depending on the load-dependent power supply unit used. A further disadvantage may be that merely specific load-dependent power supply units matched to the characteristics of the amplifier may be used.

SUMMARY

Therefore, it may be useful to provide an audio amplifier which has protection against excessive output power. In particular, it may be useful for the audio amplifier to be configured to be operable with power supply units in which the output voltage does not fall under load.

It may further be useful to emulate the fall in the output voltage of the power supply unit under load in a signal limiting circuit connected upstream of the power amplifier, so that the audio signal entering the power amplifier is already limited depending on the load and hence there is no longer any need for a power supply unit that performs the load-dependent limiting.

Hence, the audio amplifier may, for example, also be operated with a power supply unit in which the output voltage does not fall under load, and an output signal which is reduced under load may be produced, as required. Thus, the demands on the power supply unit may be decoupled from the demands on the signal limiting, which may be taken into account by a suitable design of the signal limiting circuit. Hence, when designing the power supply unit, it may no longer be necessary to take into consideration disadvantageous influencing of the tonal properties during signal limiting. A further advantage may be that when the components of the signal limiting circuit are implemented in software, for example on a digital signal processor (DSP), the hardware components of the audio amplifier may, for example, be designed independently of the design of the software which brings about the signal limiting.

In an embodiment, the signal limiting circuit may, for example, comprise or be comprised in a digital signal processor (DSP), and the fall in the output voltage from the power supply unit may be calculated in the form of a model in the DSP. Specifically, a model of a (load-dependent) power supply unit may be programmed into the DSP of the audio amplifier. The power, which may be output by one or more audio channels, may be captured by the DSP, and the state of the power supply unit model may be calculated in real time. The design of the model may allow a falling output voltage from a power supply unit to be simulated and hence the output power to be reduced. This concept may allow for the design of audio amplifiers with a briefly high output power even with power supply units in which the output voltage does not fall under load, for example, because they are corrected (e.g. regulated).

Furthermore, the tonal influences of the power reduction may no longer be dependent on the actual physical power supply unit that is used, but rather may now be dependent (e.g. merely) on the design of the model which is in the DSP. This may simplify porting a desired tonal response to other audio amplifiers, or replacing the power supply unit within an appliance (e.g., an audio amplifier) with another without having to accept tonal influences.

DESCRIPTION OF THE DRAWINGS

The accompanying drawings are included to provide an understanding of embodiments, and together with the description, serve to explain principles of embodiments.

DETAILED DESCRIPTION

Figure 1:
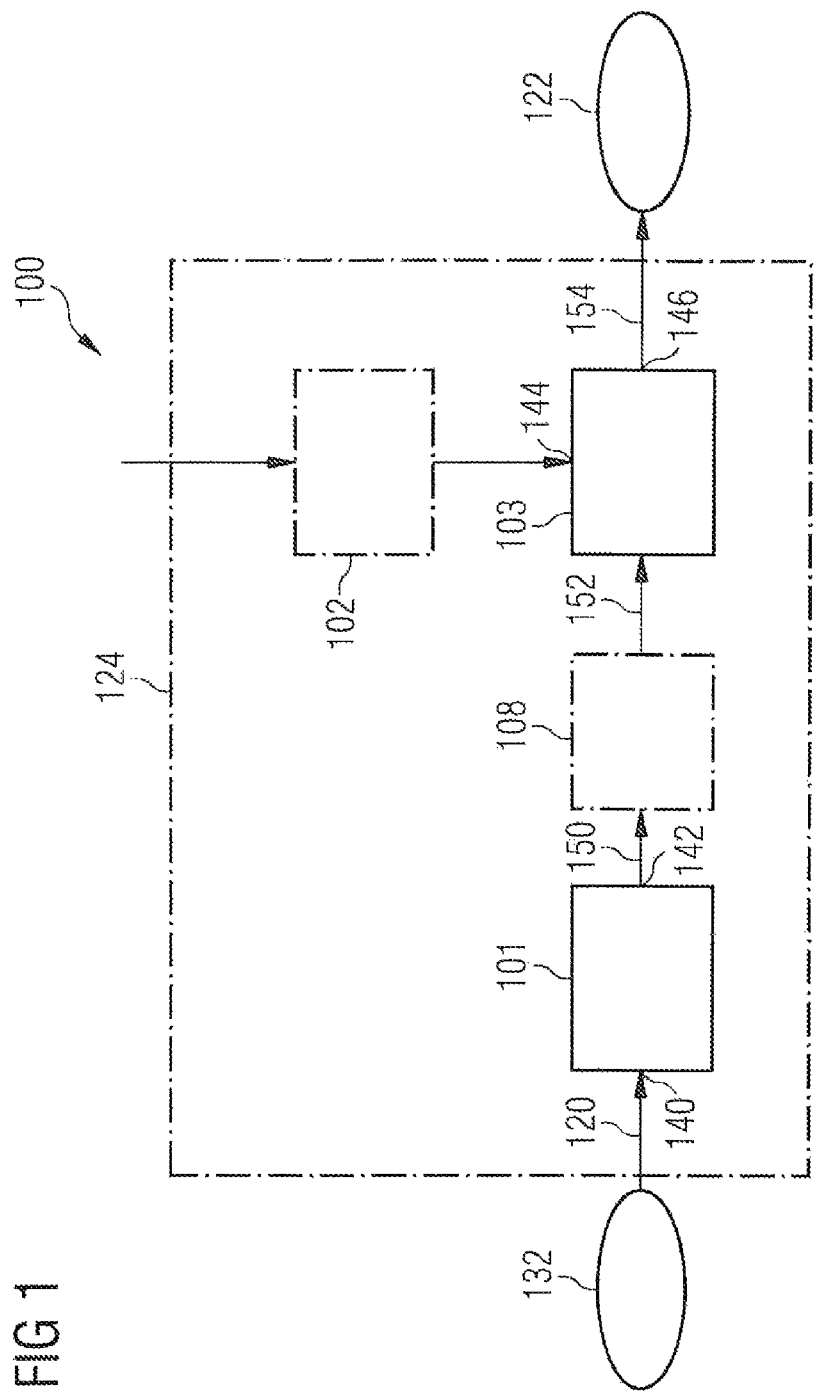
FIG. 1 is a block diagram of an audio amplifier based on an exemplary embodiment.

FIG. 1 illustrates an exemplary block diagram of an audio amplifier 100. The audio amplifier 100 may comprise a signal limiting circuit 101 and a power amplifier 103. The signal limiting circuit 101 may have an input 140, in order to receive an audio signal 120, and/or an output 142, in order to provide a limited audio signal 150 at said output. The audio amplifier 100 may be coupled to an audio source 132, which may emit an audio signal which may be received by the signal limiting circuit 101 as an audio signal 120.

The audio signal 120 may be limited in the signal limiting circuit 101 depending on the load. For example, driving a load 122 (e.g., a loudspeaker or a loudspeaker array) with a signal that is based on the limited audio signal 150 may involve the limited audio signal 150 being reduced in the event of excessively high powers appearing. This may correspond to the response of a power supply unit in which the output voltage falls under load. When a load 122 is operated on the audio amplifier 100, the output power of said load may therefore be reduced in comparison with an audio amplifier without signal reduction, which means that the load may effectively be prevented from being destroyed or damaged. The load-dependent limiting of the audio signal 120 can be adjusted in the signal limiting circuit 101 by a model of a power supply unit in which the output voltage falls under load, as illustrated by the exemplary block diagrams illustrated in FIGS. 3, 4 and 5. This may virtually relocate the load-dependent characteristic of such a power supply unit into the signal limiting circuit 101, as a result of which the power amplifier 103 may be operated with any desired power supply unit 102, particularly including the power supply units in which the output voltage does not fall under load (e.g., because they have a control loop which counteracts such a response). The signal limiting circuit 101 may promote that when the load 122 is applied, the limited audio signal 150 is effectively limited depending on the load 122.

The signal limiting circuit 101 may comprise a digital signal processor which may receive a digital audio signal 120 and may limit the digital audio signal 120 to the limited audio signal 150, which may then be available as a limited digital audio signal 150. The signal limiting circuit 101 may comprise a digital microcontroller or microprocessor which may receive a digital audio signal 120 and may limit the digital audio signal 120 to the limited audio signal 150, which may then be available as a limited digital audio signal 150. The signal limiting circuit 101 may also comprise a digital signal processor and/or a digital microcontroller, which may together limit the digital audio signal 120 to the limited audio signal 150. In these cases, the load-dependent limiting may already take place in the digital domain rather than in the analogue domain, as in ordinary audio amplifiers, and the power loss on the analogue components may be reduced accordingly.

The signal limiting circuit 101 may also have one or more analogue components which may receive an analogue audio signal 120 and limit the analogue audio signal 120 to the limited audio signal 150, which may then be available as a limited analogue audio signal 150. In an example, one or more analogue components may comprise one or more operational amplifiers and/or comparators. In another example, analogue limiting can be implemented by a comparator which may compare the analogue audio signal 120 with a load-dependent threshold value and may perform load-dependent limiting (e.g., based on the load-dependent threshold value) in the event of said threshold value being exceeded.

The power amplifier 103 may receive a signal 152 which may be based on the limited audio signal 150. A digital-to-analogue converter 108 may optionally be connected into the signal path between the signal limiting circuit 101 and the power amplifier 103 to convert the limited audio signal 150 provided by the signal limiting circuit 101 into the signal 152. By way of example, such a digital-to-analogue converter 108 may be necessary when the signal limiting circuit 101 has a digital signal processor or a microprocessor which performs the limiting and/or delivers a limited digital audio signal 150. Optionally, there may also be one or more other signal processing units connected in the path between the signal limiting circuit 101 and the power amplifier 103, which may, for example, filter and/or average stages and/or preamplifiers. In one or more configurations, however, the signal 152 may be based on the limited audio signal 150 (e.g., such that the limited audio signal 150 may be used to produce the signal 152). In an embodiment, the power amplifier 103 may be an analogue stage and the signal 152 which the power amplifier 103 receives may be an analogue signal. The power amplifier 103 may amplify the signal 152 based on the limited audio signal 150 and may provide it as a level-limited audio signal 154 (e.g., an audio signal that has the voltage level limited) at an output 146.

The audio signal 154 at the output of the audio amplifier 100 may therefore be limited in voltage level so as to be able to operate the load 122 at limited power. That is, the voltage in the load 122 may be converted into a power that is dependent on the load (e.g., on the impedance of a loudspeaker), where the power limiting of the load may result as a consequence of the voltage limiting of the audio signal 154.

The power amplifier 103 may have a supply connection 144 which may be coupled to a power supply unit 102 to supply power to the power amplifier 103. The power supply unit 102 may optionally be part of the audio amplifier 100, but it may also be accommodated outside the audio amplifier 100, so that the supply connection 144 may be routed out of the audio amplifier 100 to allow the connection of an external power supply unit. The power supply unit 102 may therefore be an assembly of the audio amplifier 100 in the first case, and it may be a standalone appliance outside the audio amplifier 100 in the second case. The power supply unit 102 may be used to supply power to the audio amplifier 100. For this purpose, the power supply unit 102 can be connected to a power source (e.g., to the 220V or 110V AC mains and/or to a private power supply system). The audio amplifier 100 may be designed such that it requires a different power supply from that provided by the mains. The voltage conversion and/or the matching to the requirements of the audio amplifier 100 may be brought about by the power supply unit 102. The output voltage and the maximum output current from the power supply unit 102 may be permanently set or variable. The power supply unit 102 may be a switched-mode power supply unit and/or a transformer power supply unit. In the case of the former, the power supply unit may be of regulated or unregulated design.

The output 146 of the power amplifier may be coupled to a load 122, as a result of which the load 122 can be operated with the level-limited audio signal 154 at limited power. Between the output 146 of the power amplifier 103 and the load 122, there may also be further units, for example power output stages or filter units, in the signal path.

The audio amplifier 100 may have a housing 124 which may accommodate the signal limiting circuit 101 and/or the power amplifier 103. It may also accommodate an optionally present digital-to-analogue converter 108 and/or an optionally present (e.g., internal) power supply unit 102 and/or also one or more other signal processing units, which may not be shown in FIG. 1.

The audio amplifier 100 described here may (e.g., also) be designed using one or more power supply units in which the output voltages do not fall under load. Furthermore, the tonal properties of the power reduction may no longer be dependent on the actual physical power supply unit 102 used, but may rather now depend merely on the design of the load-dependent limiting in the signal limiting circuit 101. It may therefore be possible to implement different tonal characteristics by choosing an appropriate model of load-dependent limiting in the signal limiting circuit 101. A desired tonal response may therefore easily be ported to other audio amplifiers 100. It may also be a simple matter for the power supply unit 102 within an audio amplifier 100 to be replaced by another without having to accept tonal influences.

By way of example, the audio amplifier 100 may be used for audio signal amplification for one or more (e.g., powerful) loudspeakers which may be used for public addresses in large rooms or open areas. Such loudspeakers may produce an acoustic power of over 50 watts, particularly over 100 watts, which, when a loudspeaker has an acoustic efficiency of no more than 5%, for example, corresponds to electrical powers of over 1000 watts, and particularly electrical powers of over 2000 watts. The audio amplifier 100 may (e.g., also) be used for the audio signal amplification in the case of loudspeaker arrays with a multiplicity of individual loudspeakers, in which relatively high acoustic powers in the region of multiples of 50 watts or 100 watts arise. The audio signal to be amplified may be in the audible AF range from approximately 20 Hz to 20 kHz and/or above.

Figure 2:
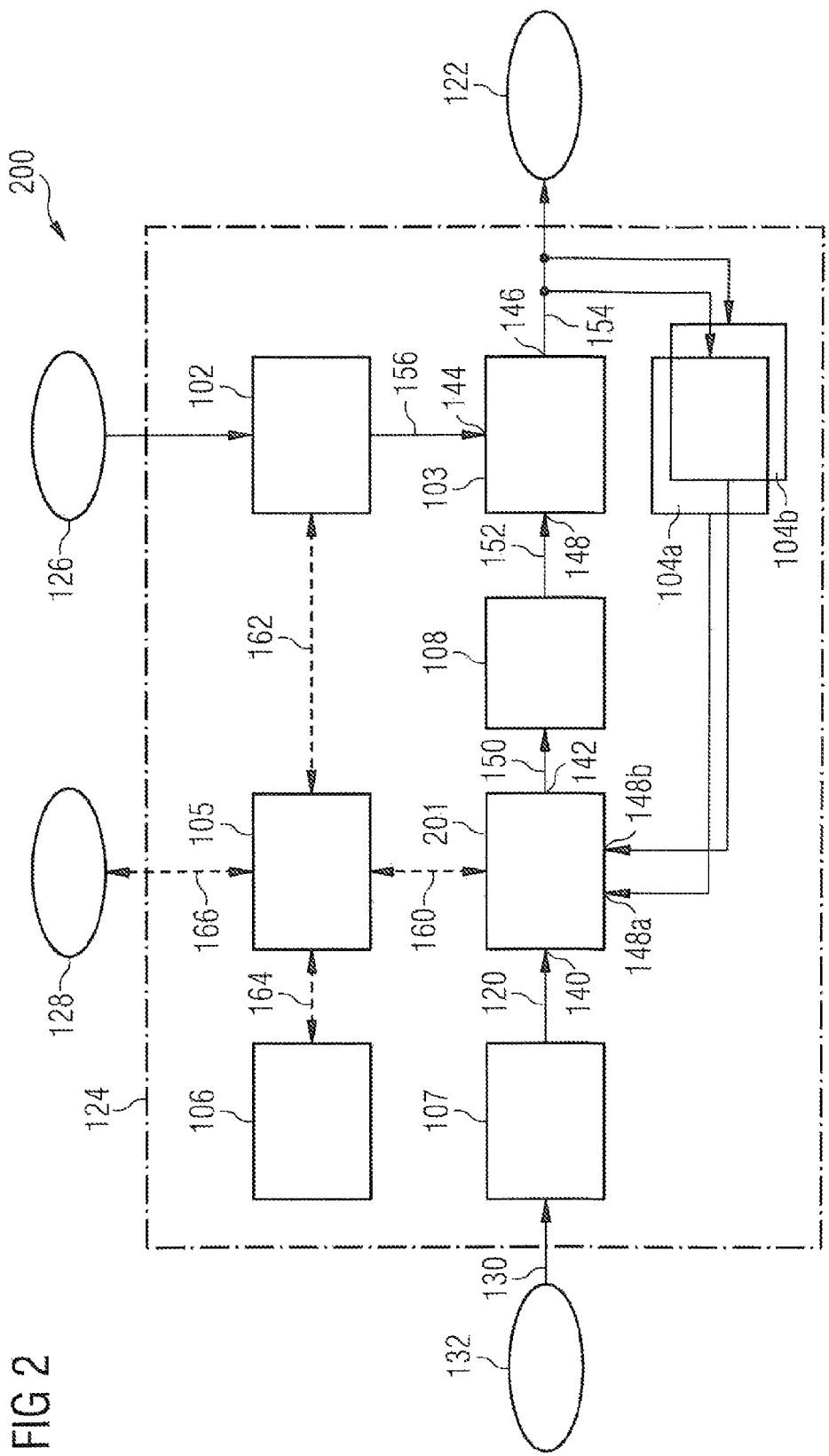
FIG. 2 is a block diagram of an audio amplifier based on an exemplary embodiment.

FIG. 2 illustrates an exemplary block diagram of an audio amplifier 200. The audio amplifier 200 may have a DSP 201, a power amplifier 103, a power supply unit 102, two analogue-to-digital converters 104a and 104b, a further digital-to-analogue converter 108, a digital input receiver 107, a controller 105 and/or a user interface unit 106. The digital input receiver 107 may be connected between an analogue audio source 132 and an input 140 of the DSP 201 in order to convert an analogue signal 130 from the analogue audio source 132 into digital format and/or to provide it for the DSP 201 at the input 140 thereof as a digital audio signal 120. The digital-to-analogue converter 108 may be connected between an output 142 of the DSP 201 and an input 148 of the power amplifier 103 in order to make the limited audio signal 150 produced by the DSP 201 available to the power amplifier 103 in analogue form as an analogue signal 152. The power amplifier 103 may have a supply connection 144 which may be coupled to the power supply unit 102 to allow it to be supplied with the output voltage 156 from the power supply unit 102. The power supply unit 102 may have a supply voltage input which may be coupled to a supply voltage source 126.

The power supply unit 102 may be part of the audio amplifier 200 and may be an assembly of the audio amplifier 200. The power supply unit 102 may be used to supply power to the audio amplifier 200. For this purpose, the power supply unit 102 may be coupled to the supply voltage source 126. By way of example, the supply voltage source may be the 220V or 110V AC mains or a private power supply system. The audio amplifier 200 may (e.g., usually) be designed such that it requires a different power supply from that provided by the voltage supply source 126. The voltage conversion and the matching to the requirements of the audio amplifier 200 may be brought about by the power supply unit 102. The output voltage and the maximum output current of the power supply unit 102 may be permanently set and/or variable. The power supply unit 102 may be a switched-mode power supply unit and/or a transformer power supply unit. In the case of the former, the power supply unit may be of regulated and/or unregulated design.

The power amplifier 103 may have an output 146 coupled to a load 122 in order, for example, to drive the load with the level-limited audio signal 154. The analogue-to-digital converters 104a and 104b may be connected between the output 146 of the power amplifier 103 and a respective control unit 148a and 148b of the DSP 201 in order, for example, to provide the DSP 201 with the level-limited audio signal 154 in digital form, wherein the analogue-to-digital converter 104a may convert a current component and the analogue-to-digital converter 104b may convert a voltage component of the level-limited audio signal 154 into digital form. The controller 105 may be coupled to the DSP 201 via a configuration interface 160, may be coupled to the power supply unit 102 via a control interface 162, may be coupled to the user interface unit 106 via a user interface 164 and/or may be coupled to the remote control unit 128 via a remote control interface 166.

In an embodiment, the signal limiting circuit 101 from FIG. 1 is in the form of a digital signal processor (DSP) 201, and the power amplifier 103 may correspond to the power amplifier 103 from FIG. 1. The received audio signal 120 may be a digital audio signal which may be received at an input 140 of the DSP 201. The DSP 201 may limit the digital audio signal 120 received at this input 140 and/or may provide it as a limited digital audio signal 150 at an output 142. In this embodiment, the input 140 and the output 142 may be shown as an input and/or an output of the DSP 201. In other embodiments, in which the signal limiting circuit 101 may comprise not merely the DSP 201 but also one or more other circuit units, the input 140 and the output 142 may be inputs and/or outputs of the signal limiting circuit 101 which may be coupled to inputs and/or outputs of the DSP 201 via the one or more other circuit units. While the exemplary embodiment in FIG. 2 may relate to a DSP 201, the same explanations may apply, mutatis mutandis, even when, instead of the DSP 201, a digital microcontroller and/or microprocessor may be used and/or when the functionality described here for the DSP 201 may be performed (e.g., both) by a DSP, a microcontroller, a microprocessor, and/or further digital hardware.

The DSP 201 may deliver a limited digital audio signal 150 at its output 142. The power amplifier 103 may amplify a signal 152 which may be based on the limited digital audio signal 150. The power amplifier 103 may be an analogue component which may receive an analogue signal 152 at an input 148. To convert the limited digital audio signal 150 into an analogue signal 152, a digital-to-analogue converter 108 which converts the limited digital audio signal 150 into the analogue signal 152 may be used (e.g., such that the analogue signal 152 may be based on the limited digital audio signal 150). The block 108, which may be denoted as a digital-to-analogue converter, may also have one or more other circuit units, such as, for example, one or more sampling rate converters (e.g., one or more circuits for reducing and/or increasing the sampling rate of the limited digital audio signal 150, so as to set any desired sampling rate for the limited digital audio signal 150), and/or one or more filter stages, which may (e.g., either) be implemented in the digital-to-analogue converter 108 and/or connected downstream of the digital-to-analogue converter 108, in order to implement a particular frequency response for the analogue signal 152 based on the limited digital audio signal 150.

The power amplifier 103 may have a supply connection 144 which may be coupled to a power supply unit 102 and to which a power supply unit 102 may be connected. The power supply unit 102 may, but does not have to, be one in which the output voltage 156 falls under load. By way of example, it may be a power supply unit 102 which delivers a constant output voltage 156, for example by virtue of internal control loops which may operate such that a sufficiently constant output voltage 156 may be provided at the voltage output. The power supply unit 102 may have an input which may be coupled to a supply voltage source 126 which may deliver the supply voltage from which the power supply unit 102 may produce the output voltage 156 and may make it available to the power amplifier 103 at the power supply input 144.

The input 140 of the digital signal processor 201 may receive a digital audio signal 120 which may be based on an audio signal 130 which may be provided by an audio source 132. The audio source 132 may be a digital and/or analogue audio source which may provide a digital audio signal 130 and/or an analogue audio signal 130. In the case of a digital audio source 132, the DSP 201 may have an upstream digital circuit unit 107 in the form of a digital input receiver (DIR) which (e.g., if necessary and/or requested) may perform sampling rate conversion for the digital audio signal 130 so as to produce a converted digital audio signal 120 which may have a desired sampling rate so that it can be received by the input 140 of the DSP 201. If the digital audio signal 130 already has the desired properties, the digital input receiver 107 can also be omitted, such that the digital audio signal 130 may be received directly by the input 140 of the DSP 201.

In an embodiment of an analogue audio source 132, the DSP 201 may have an upstream analogue-to-digital converter 107 and/or optionally one or more other (e.g., upstream) circuit units, where said analogue-to-digital converter may convert the analogue audio signal 130 into a digital audio signal 120 which may be received by the input 140 of the DSP 201. By way of example, the one or more other circuit units may perform prefiltering on the analogue audio signal 130 (e.g., low-pass filtering, high-pass filtering and/or bandpass filtering) so that a filtered analogue audio signal 130 may be supplied to the analogue-to-digital converter 107. If necessary (e.g., and/or requested, etc.), the output signal delivered by the analogue-to-digital converter 107 may be subjected to sampling rate conversion and/or further digital filtering operations before it may be received at the input 140 of the DSP 201.

The audio amplifier 200 may have an analogue-to-digital converter 104a which may be arranged between the output 146 of the power amplifier 103 and a control input 148a of the DSP 201, and which may make the level-limited audio signal 154 produced by the power amplifier 103 at the output 146 available to the DSP 201 in digital form. This may be the level-limited audio signal 154, as present on the load 122. The DSP 201 may therefore have the opportunity to produce its limited audio signal 150 in a manner dependent on the load, since coupling the output 146 of the power amplifier 103 to the load 122 may involve the level-limited audio signal 154 assuming a load-dependent value.

The level-limited audio signal 154 produced by the power amplifier 103 may be measured using its current component and/or using its voltage component. In the exemplary block diagram in FIG. 2, (e.g., both) the current component and/or the voltage component may be measured, with the analogue-to-digital converter 104a converting a current component of the level-limited audio signal 154 into digital format and making it available to the DSP 201 at the control input 148a. A further analogue-to-digital converter 104b, which may be arranged between the output 146 of the power amplifier 103 and a further control input 148b of the DSP 201, may convert a voltage component of the level-limited audio signal 154 into digital format and may make it available to the DSP 201 at the further control input 148b. Hence, the DSP 201 can determine the limited audio signal 150 based on the power of the level-limited audio signal 154 and/or based on the power on the load 122.

In another embodiment, the audio amplifier 200 may have (e.g., merely) one of the two analogue-to-digital converters 104a and 104b, as a result of which merely one current component of the level-limited audio signal 154 may be made available to the DSP 201, for example. Since a load-dependent value may be obtained for the current component of the level-limited audio signal 154 when the output 146 of the power amplifier 103 is coupled to the load 122, the DSP 201 may be able to produce the limited audio signal 150 depending on the load.

Alternatively (e.g., and/or additionally), in an embodiment with just one of the two analogue-to-digital converters 104a and 104b, it may also be possible for the voltage component (e.g., instead of the current component) to be made available to the DSP 201. However, the load dependency of the voltage may merely be minimal and may be determined primarily by the internal resistance of the amplifier and/or the losses on the lines. As a result, the changes in the load 122 may become noticeable merely slightly in the voltage. It may therefore be preferable to deliver the current component to the DSP 201 with just one of the A/D converters 104a and 104b.

In a different embodiment, the audio amplifier 200 may have neither of the two analogue-to-digital converters 104a and 104b. In such an exemplary embodiment, information about the load 122, for example impedance values for the load, and/or the power amplifier 103 may be made available to the DSP 201, and may be used in the DSP 201 to calculate how the limited audio signal 150 produced by the DSP 201 may be converted into the level-limited audio signal 154 in order to drive the load. This information may allow the DSP 201 to produce the limited audio signal 150 depending on the load.

The DSP 201 may produce the limited audio signal 150 on the basis of a model 310 of a power supply unit in which the output voltage may fall under load. Such a model, as described in more detail in the subsequent discussion related to FIGS. 3, 4 and/or 5, may be used to produce the limited audio signal 150 depending on the load. As mentioned above, such load-dependent power supply units in which the output voltage is controlled to fall under load are used as power supply units for conventional audio amplifiers in order reduce the maximum output voltage of the power amplifier. Thus, in accordance with the disclosure, the functionality of providing a level-limited audio signal is integrated into the audio amplifier and may therefore e.g. be removed from the (formerly load-dependent) power supply unit.

The audio amplifier 200 may have a configuration interface 160 in order to transmit control and/or configuration data between a controller 105 or microprocessor and the DSP 201. The controller 105 may be coupled to the power supply unit 102 via a control interface 162 in order to use one or more control commands to set the power supply unit 102 and/or to request information from the power supply unit 102. The controller 105 may be coupled to a user interface unit 106 via a user interface 164 in order to use control commands to configure the controller 105 and/or to load code into it and/or to request information from the controller 105. The controller 105 may be coupled to a remote control unit 128 via a remote control interface 166 in order to use control commands to configure the controller 105 by remote control and/or to load code into it and/or to request information from the controller 105 by remote control.

The DSP 201 and the controller 105 may be produced as one circuit, which may correspond to the signal limiting circuit 101 from FIG. 1. The functionality of the DSP 201 may be performed fully and/or in part by the controller 105. Similarly, the functionality of the controller 105 may be performed fully and/or in part by the DSP 201.

The audio amplifier 200 may have a housing 124 which may accommodate the DSP 201, the power amplifier 103, the power supply unit 102, at least one of the analogue-to-digital converters 104a and/or 104b, the digital-to-analogue converter 108, the digital input receiver 107, the controller 105 and/or the user interface unit 106.

The audio amplifier 200 may be used for audio signal amplification for (e.g., powerful) loudspeakers that may be used for public address in large rooms and/or open areas.

Loudspeakers of this kind produce an acoustic power of over 50 watts, and often over 100 watts. The audio amplifier 200 may also be used for the audio signal amplification in the case of loudspeaker arrays with a multiplicity of individual loudspeakers arranged above one another, in which relatively high acoustic powers in the region of multiples of 50 watts may arise. The audio signal to be amplified may be in the audible or just (e.g., barely) inaudible AF range from approximately 20 Hz to 20 kHz and above.

Figure 3:
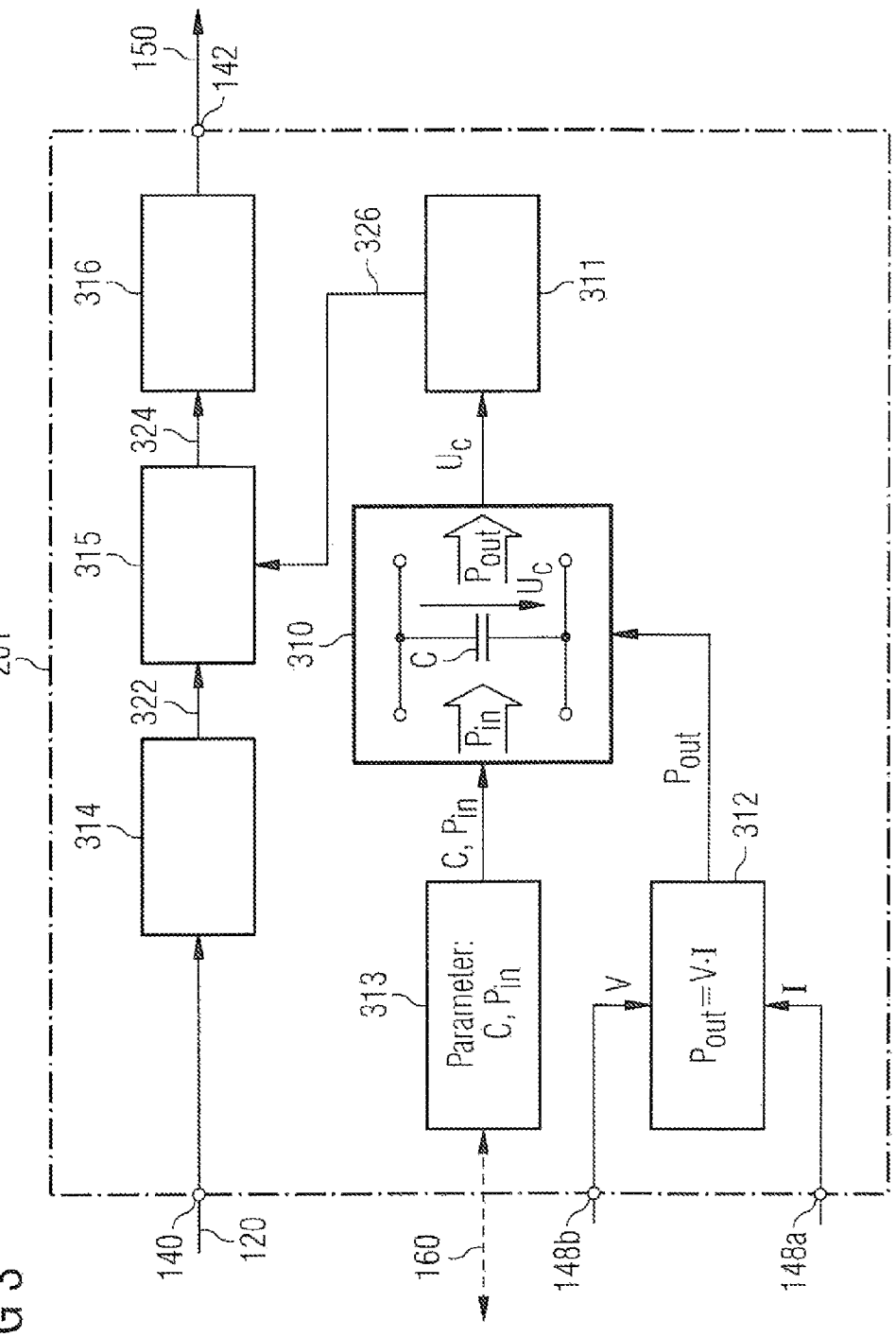
FIG. 3 is a block diagram of a digital signal processor in an audio amplifier based on an exemplary embodiment.

FIG. 3 illustrates an exemplary block diagram of a digital signal processor 201 in an audio amplifier 200. The DSP 201 may correspond to the DSP 201 described in FIG. 2. The DSP 201 may have a signal path between the input 140 and the output 142, into which signal path a first audio processing unit 314, a peak value limiting unit 315 and/or a second audio processing unit 316 may have been connected. The input 140 may correspond to the input 140 shown in FIG. 2 for the DSP 201, at which the digital audio signal 120 may be received. The output 142 may correspond to the output 142 shown in FIG. 2, at which the limited digital audio signal 150 may be provided.

The DSP 201 may (e.g., also) have a control path between two control inputs 148a and 148b of the DSP 201 and the peak value limiting unit 315, where the control path may be used to actuate the peak value limiting unit 315 with a controlled variable 326. The two control inputs 148a and 148b may correspond to the control inputs 148a and 148b described in FIG. 2 for the DSP 201. The control path may have a multiplication unit 312, a modelling unit 310 and/or a control unit 311 connected into it, wherein the modelling unit 310 may obtain its input parameters for modelling a power supply unit in which the output voltage $U_C$ falls under load from a parameter memory 313 and from the multiplication unit 312. The parameter memory 313 may use a parameter interface to provide the modelling unit 310 with a first parameter C, which may correspond to a virtual capacitance, and with a second parameter $P_{in}$, which may correspond to a prescribable maximum input power for the power amplifier 103. The multiplication unit 312 may provide the modelling unit 310 with a third variable (directly controlled variable) $P_{out}$ which may be variable in operation and which may correspond to an output power of the power amplifier 103. The multiplication unit 312 comprises two inputs which may correspond to the control inputs 148a and 148b of the DSP 201 and at which the multiplication unit 312 may receive a current component I and/or a voltage component V of the level-limited audio signal 154 produced by the power amplifier 103 in digital form. From the voltage component U and/or the current component I, the multiplication unit 312 may form the product, which may emulate a power $P_{out}$ of the level-limited audio signal 154 produced by the power amplifier 103. The multiplication unit 312 may comprise an integrator, a summator and/or an averaging unit, which it may use to make an averaged power $P_{out}$ available to the modelling unit 310.

The parameter memory 313 may be externally accessible via an external configuration interface 160 which may be used to set and/or request the parameters C and $P_{in}$ stored in the parameter memory 313. The parameter memory 313 may be an internal memory in the DSP 201, as shown in FIG. 3. Alternatively, the parameter memory 313 may be an external memory which the DSP 201 may access via an external memory interface (e.g., such that the parameter memory 313 may be implemented outside the DSP 201, contrary to the illustration in FIG. 3).

The modelling unit 310 may emulate a model of a power supply unit in which the output voltage $U_C$ may fall under load. The model may comprise a virtual capacitance C which may be charged with the supplied power $P_{in}$ and may be discharged with the drawn power $P_{out}$. When the output of the virtual capacitance C is connected to a load, the virtual capacitance C may discharge, with a load-dependent discharge current flowing and (e.g., at the same time) the output voltage $U_C$ across the virtual capacitance C dipping. The output voltage $U_C$ may fall under load. If the supplied power $P_{in}$ corresponds to the output power $P_{out}$, a power equilibrium may establish itself on the virtual capacitance C and the virtual capacitance may remain in the charged state. If the supplied power $P_{in}$ is higher than the output power $P_{out}$, the virtual capacitance may be charged.

The model of the virtual capacitance may be suitable for implementing power limiting control. So long as the drawn power $P_{out}$ is less than the suppliable power $P_{in}$, the output voltage $U_C$ may assume its maximum value $U_0$.

The virtual capacitance C may tolerate (e.g., briefly occurring) high power peaks in the drawn power $P_{out}$, which may bring about partial discharge of the virtual capacitance C. In the case of high RMS powers in the drawn power, on the other hand, the virtual capacitance may be discharged to a high degree.

In one example, the output voltage $U_C$ may fall merely slightly below its maximum value, whereas in a different example, the output voltage $U_C$ may quickly fall to one or more low values.

Depending on the desired output power $P_{out}$, the supplied power $P_{in}$ may be set such that a power equilibrium may be produced on the virtual capacitance C. This may make it possible to implement a setting in which brief power peaks may be transmitted whereas high RMS power values may be limited.

The supplied power $P_{in}$ may be a constant parameter and may not change in the course of operation. $U_0$ may be an upper limit for the suppliable power.

Such power limiting control may be implemented in the modelling unit 310, wherein the supplied power $P_{in}$ may correspond to a prescribed parameter which may specify the maximum input power on the virtual capacitance C, and the output power $P_{out}$ may denote the power which may actually be drawn for the load 122, which the multiplication unit 312 may have calculated on the basis of the level-limited audio signal 154 applied to the load 122.

On the basis of the output voltage $U_C$, the control unit 311 may determine a controlled variable 326 which may be used to actuate the peak value limiting unit 315. The peak value limiting unit 315 may be used to limit the power peaks in the digital audio signal 120 applied to the input 140 by using the controlled variable 326. Specifically, the digital audio signal 120 may enter the first audio processing unit 314, in which it may be subjected to digital filtering and/or to routing in order to be received as a filtered digital audio signal 322 by the peak value limiting unit 315. In the peak value limiting unit 315, the filtered digital audio signal 322 may be limited on the basis of the controlled variable 326 from the control unit 311, said limiting being brought about by reducing the signal level of the digital audio signal 322. The limited filtered digital audio signal 324 produced in this manner may enter the second audio processing unit 316, in which it may be subjected to further digital filtering and/or further limiting and may be provided at the output 142 of the DSP 201 as a limited digital audio signal 150. The further limiting may be independent of load (e.g., limiting which matches the limited digital audio signal 150 to a subsequent digital-to-analogue converter 108).

In another embodiment, the DSP 201 may have no audio processing units 314 and/or 316. In that case, the signal 120 may correspond to the signal 322 and the signal 324 may correspond to the signal 150. Alternatively, the DSP 201 may have no first audio processing unit 314. In that case, the signal 120 may correspond to the signal 322. Alternatively, the DSP 201 may have no second audio processing unit 316. In that case, the signal 324 may correspond to the signal 150.

Figure 4:
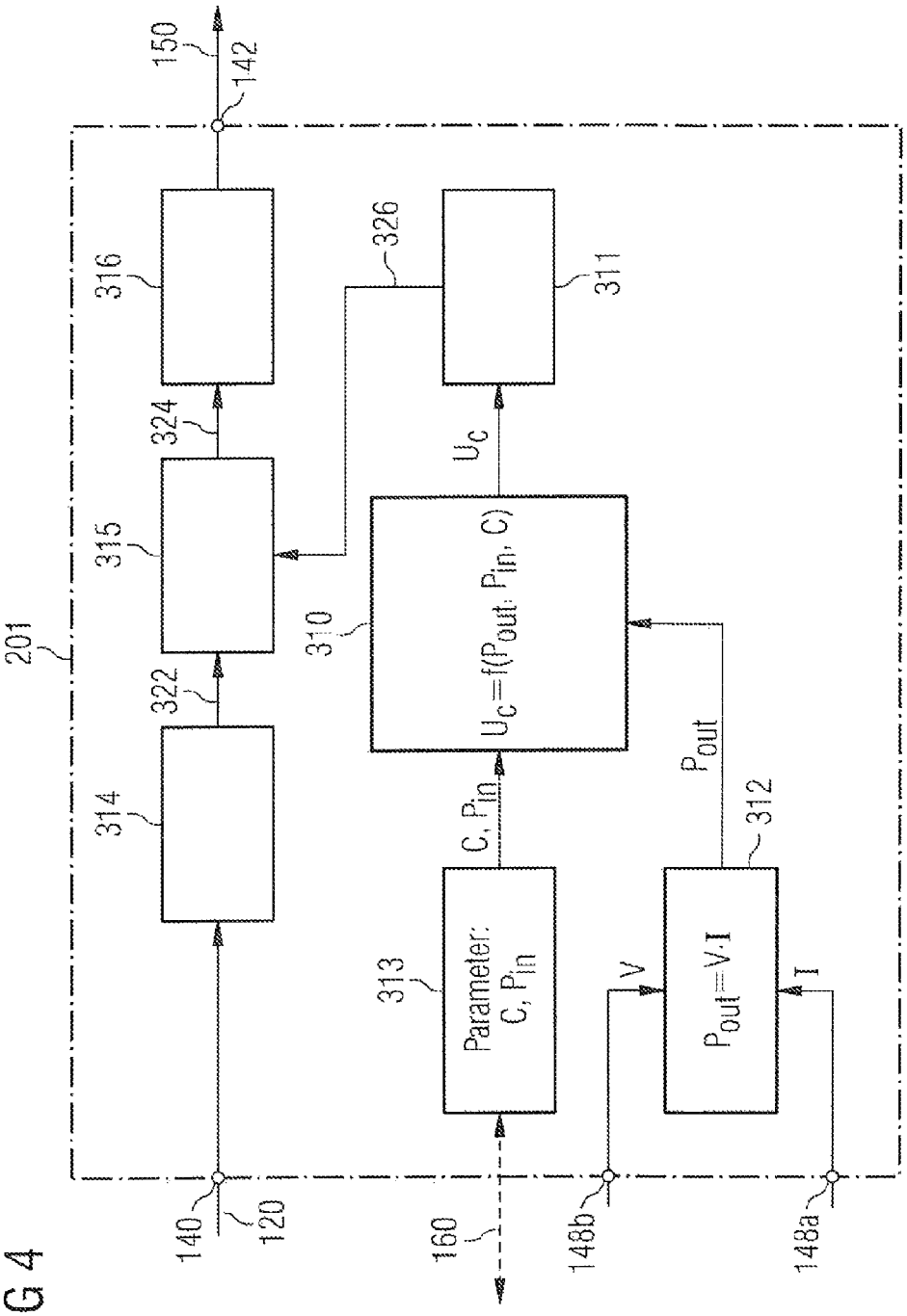
FIG. 4 is a block diagram of a digital signal processor in an audio amplifier based on an exemplary embodiment.

FIG. 4 illustrates an exemplary block diagram of a digital signal processor 201 in an audio amplifier 200. The DSP 201 may correspond to the DSP 201 described in FIG. 2 and/or to the DSP 201 described in FIG. 3.

For the model of a power supply unit in which the output voltage $U_C$ falls under load, where the power supply unit is emulated in the modelling unit 310, the relationship described below may apply. Between the energy $W_C$ stored in the virtual capacitance C and the voltage $U_C$ across the virtual capacitance C, the following relationship may apply:

$$W_C = \tfrac{1}{2} \cdot C \cdot U_C^2.$$

On the other hand, there may be a differential relationship between energy and power. Thus, power may be the time derivation of energy and energy may be power integrated with respect to time:

$$W_C = \int (P_{in} - P_{out}) dt.$$

Hence, the right-hand sides of both equations correspond, and the following relationship applies:

$$U_C = f(P_{out}, P_{in}, C).$$

Figure 5:
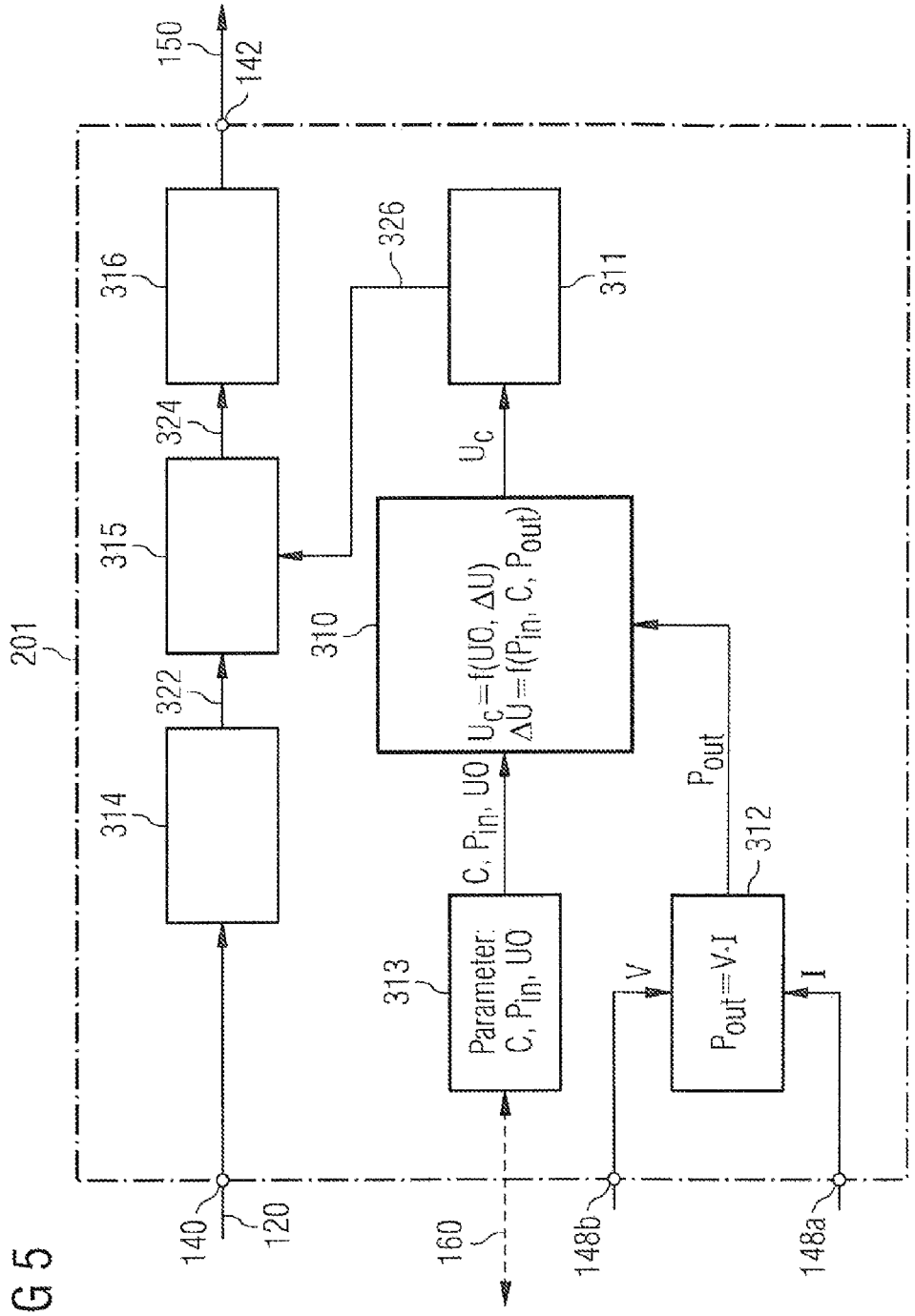
FIG. 5 is a block diagram of a digital signal processor in an audio amplifier based on an exemplary embodiment.

FIG. 5 illustrates an exemplary block diagram of a digital signal processor 201 in an audio amplifier 200. The DSP 201 may correspond to the DSP 201 described in FIG. 2 and/or to the DSP 201 described in FIG. 3 and/or FIG. 4.

For the model of a power supply unit in which the output voltage $U_C$ falls under load, where the power supply unit is emulated in the modelling unit 310, the relationship described below may apply. Between the energy $W_C$ stored in the virtual capacitance C and the voltage $U_C$ across the virtual capacitance C, the following relationship may apply:

$$W_C = \tfrac{1}{2} \cdot C \cdot U_C^2.$$

On the other hand, there may be a differential relationship between energy and power. Thus, power may be the time derivation of energy and energy may be power integrated with respect to time:

$$W_C = \int (P_{in} - P_{out}) dt.$$

If $P_{in}$ and C are assumed to be constant, it may be possible to calculate the voltage value $U_C$ by observing the drawn power $P_{out}$:

$$\tfrac{1}{2} \cdot C \cdot \Delta U^2 = \int (P_{in} - P_{out}) dt$$

and from that:

$$\Delta U^2 = 2/C \cdot \int (P_{in} - P_{out}) dt.$$

Bearing in mind an initial condition for $U_C$, $U_C(0) = U_0 =$ constant, the following may be obtained:

$$U_C^2 = U_0^2 + \Delta U^2$$

and hence:

$$U_C = \sqrt{(U_0^2 + \Delta U^2)}.$$

The initial condition for $U_C$, $U_C(0) = U_0$ may be stored in the parameter memory 313 as a prescribable parameter which may be supplied to the modelling unit 310 via the parameter interface.

Figure 6:
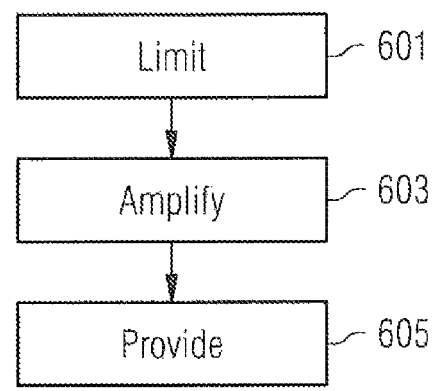
FIG. 6 is a schematic illustration to explain a method for amplifying a digital audio signal based on an exemplary embodiment.

FIG. 6 illustrates an exemplary schematic that demonstrates a method for amplifying an audio signal 120. The method may have the acts indicated below. In a first act 601, an audio signal 120 may be limited in order to produce a limited audio signal (150). In a second act 603, a signal 152 based on the limited audio signal 150 may be amplified in order to produce a level-limited audio signal 154. In a third act 605, the level-limited audio signal 154 may be provided at an output 146 which may be coupled to a load 122, as a result of which the load 122 may be operated at limited power because it is subject to level limiting. In this case, the limiting 601 may take place such that the limited audio signal 150 may be limited depending on the load.

Although specific embodiments have been illustrated and described herein, it will be appreciated by those of ordinary skill in the art that a variety of alternate and/or equivalent implementations may be substituted for the specific embodiments shown and described without departing from the scope of the claimed subject matter. This application is intended to cover any adaptations or variations of the specific embodiments discussed herein. Therefore, it is intended that this disclosure be limited merely by the claims and the equivalents thereof.

What is claimed is:

1. An audio amplifier, comprising:
a signal limiting circuit configured to:
  limit an audio signal received at an input; and
  provide the limited audio signal at a first output; and
a power amplifier comprising a supply connection configured to be coupled to a power supply unit to supply power to the power amplifier, the power amplifier configured to:
  amplify a signal based on the limited audio signal; and
  provide the amplified signal as a level-limited audio signal at a second output configured to be coupled to a load, such that the load can be operated at limited power, the signal limiting circuit configured to produce an audio signal that is limited based on the load, the signal limiting circuit configured to determine the audio signal based on a function of a prescribable maximum input power of the power amplifier, an output power of the power amplifier and a virtual capacitance.

2. The audio amplifier of claim 1, the load comprising a loudspeaker.

3. The audio amplifier of claim 1, the signal limiting circuit comprising at least one of a digital signal processor or a microcontroller.

4. The audio amplifier of claim 1, the signal limiting circuit configured to produce the audio signal based on a model of a load-dependent power supply unit associated with an output voltage falling under load.

5. The audio amplifier of claim 1, the signal limiting circuit configured to produce the limited audio signal based on the level-limited audio signal provided at the second output.

6. The audio amplifier of claim 1, comprising a digital-to-analogue converter arranged in a signal path between the signal limiting circuit and the power amplifier.

7. The audio amplifier of claim 1, further comprising the power supply unit, the power supply unit being coupled to the supply connection of the power amplifier and configured to produce a load-independent output voltage.

8. The audio amplifier of claim 1, comprising an analogue-to-digital converter arranged between the second output and a control input of the signal limiting circuit, the analogue-to-digital converter configured to provide a current component of the level-limited audio signal for the signal limiting circuit.

9. The audio amplifier of claim 8, comprising a second analogue-to-digital converter arranged between the second output and a second control input of the signal limiting circuit, the second analogue-to-digital converter configured to provide a voltage component of the level-limited audio signal for the signal limiting circuit.

10. The audio amplifier of claim 1, the load comprising a loudspeaker array.

11. The audio amplifier of claim 1, the signal limiting circuit configured to determine the output power of the power amplifier based on a product of a current component and a voltage component of the level-limited audio signal.

12. The audio amplifier of claim 1, comprising a configuration interface configured to adjust the virtual capacitance and the prescribable maximum input power of the power amplifier.

13. A method for amplifying an audio signal, comprising:
limiting the audio signal to produce a limited audio signal, the limiting comprising determining the audio signal based on a function of a prescribable maximum input power, an output power and a virtual capacitance;
amplifying a signal based on the limited audio signal to produce a level-limited audio signal; and
providing the level-limited audio signal at an output configured to be coupled to a load, such that the load can be operated at limited power, the limiting performed based on the load.

14. The method of claim 13, the load comprising at least one of a loudspeaker or a loudspeaker array.

15. The method of claim 13, the limiting based on a model of a load-dependent power supply unit associated with an output voltage falling under load.

16. The method of claim 15, the limiting performed using the following formulae:

$$U_C = \sqrt{(U_0^2 + \Delta U^2)},$$

$$\Delta U^2 = 2/C \cdot \int (P_{in} - P_{out}) dt,$$

where Pin is a maximum prescribable input power on a virtual capacitance C, $P_{out}$ is an output power on the virtual capacitance C, $\Delta U$ is a differential voltage change on the virtual capacitance C, $U_0$ is an initial voltage on the virtual capacitance C, and $U_C$ is the output voltage.

17. The method of claim 15, the output voltage a basis for altering a threshold used to limit peak values of the audio signal.

18. An audio amplifier, comprising:
a signal limiting circuit configured to:
limit an audio signal received at an input; and
provide the limited audio signal at a first output; and
a power amplifier configured to:
amplify a signal based on the limited audio signal; and
provide the amplified signal as a level-limited audio signal at a second output configured to be coupled to a load, the limiting based on a model of a load-dependent power supply unit associated with an output voltage falling under load, the limiting performed using the following formulae:

$$U_C = \sqrt{(U_0^2 + \Delta U^2)},$$

$$\Delta U^2 = 2/C \cdot \int (P_{in} - P_{out}) dt,$$

where $P_{in}$ is a maximum prescribable input power on a virtual capacitance C, $P_{out}$ is an output power on the virtual capacitance C, $\Delta U$ is a differential voltage change on the virtual capacitance C, $U_0$ is an initial voltage on the virtual capacitance C, and $U_c$ is the output voltage.

19. The audio amplifier of claim 18, the power amplifier comprising a supply connection configured to be coupled to the load-dependent power supply unit.

20. The audio amplifier of claim 18, the signal limiting circuit configured to produce an audio signal that is limited based on the load.

* * * * *